US010585250B2

(12) United States Patent
Jou et al.

(10) Patent No.: US 10,585,250 B2
(45) Date of Patent: Mar. 10, 2020

(54) OPTICAL INTERCONNECT MODULES WITH POLYMER WAVEGUIDE ON SILICON SUBSTRATE

(71) Applicant: ADOLITE INC., Santa Clara, CA (US)

(72) Inventors: Abraham Jou, Fremont, CA (US); Paul Mao-Jen Wu, Taipei (TW)

(73) Assignee: ADOLITE INC., Santa Clara, CA (US)

( * ) Notice: Subject to any disclaimer, the term of this patent is extended or adjusted under 35 U.S.C. 154(b) by 0 days.

(21) Appl. No.: 15/963,815

(22) Filed: Apr. 26, 2018

(65) Prior Publication Data

US 2018/0337111 A1 Nov. 22, 2018

Related U.S. Application Data

(60) Provisional application No. 62/509,892, filed on May 23, 2017, provisional application No. 62/508,940, filed on May 19, 2017.

(51) Int. Cl.
*H01L 23/48* (2006.01)
*G02B 6/42* (2006.01)
(Continued)

(52) U.S. Cl.
CPC ........ *G02B 6/4214* (2013.01); *G02B 6/12011* (2013.01); *G02B 6/1221* (2013.01);
(Continued)

(58) Field of Classification Search
CPC ...... H04B 10/25; H04B 10/67; H04B 10/506; H01S 5/183; H01S 5/02284;
(Continued)

(56) References Cited

U.S. PATENT DOCUMENTS 5,282,080 A * 1/1994 Scifres ............... G02B 6/12007
359/344
5,416,861 A 5/1995 Koh et al.
(Continued)

FOREIGN PATENT DOCUMENTS

WO WO 2018/213035 A1 11/2018
WO WO 2018/213036 A1 11/2018
(Continued)

OTHER PUBLICATIONS

VLASOV "Silicon CMOS-Integrated Nano-Photonics for Computer and Data Communications Beyong 100G," IEEE Communications Magazine, 50(2):s67-s72, (2012).
(Continued)

*Primary Examiner* — Vu A Vu
(74) *Attorney, Agent, or Firm* — Alston & Bird LLP (57) ABSTRACT

An optical interconnect device on a silicon substrate is disclosed which includes a trench having two slanted side walls opposite to each other, a number of polymer waveguides formed in the trench, each including a straight portion and two end reflectors formed on the slanted side walls of the trench, a light source and an optical receiver disposed on an insulated layer on the silicon surface outside the trench. Conductive lines are patterned on the insulating layer and connects to the light source and the optical receiver. The light source and the optical receiver are aligned respectively to the two end reflectors of each polymer waveguide such that an optical path is formed from the light source device through the plurality of polymer waveguides to the optical receiver device, via reflection by the two end reflectors. A fabrication method to build the device is disclosed thereof.

7 Claims, 10 Drawing Sheets

(51) Int. Cl.

| | | |
|---|---|---|
| *H01S 5/022* | (2006.01) | |
| *H01S 5/183* | (2006.01) | |
| *H05K 1/02* | (2006.01) | |
| *G02B 6/122* | (2006.01) | |
| *G02B 6/12* | (2006.01) | |
| *H04B 10/25* | (2013.01) | |
| *H04B 10/50* | (2013.01) | |
| *H04B 10/67* | (2013.01) | |
| *H04J 14/02* | (2006.01) | |
| *G02B 6/36* | (2006.01) | |
| *H05K 1/18* | (2006.01) | |

(52) U.S. Cl.
CPC ........... *G02B 6/3652* (2013.01); *G02B 6/421* (2013.01); *G02B 6/425* (2013.01); *G02B 6/4206* (2013.01); *G02B 6/428* (2013.01); *G02B 6/4212* (2013.01); *G02B 6/4259* (2013.01); *G02B 6/4279* (2013.01); *H01S 5/02284* (2013.01); *H01S 5/183* (2013.01); *H04B 10/25* (2013.01); *H04B 10/506* (2013.01); *H04B 10/67* (2013.01); *H04J 14/02* (2013.01); *H05K 1/0274* (2013.01); *H01S 5/02292* (2013.01); *H05K 1/189* (2013.01); *H05K 2201/10121* (2013.01); *H05K 2201/10151* (2013.01)

(58) Field of Classification Search
CPC .............. H01S 5/02292; H05K 1/0274; H05K 2201/10151; H05K 1/189; H05K 2201/10121; H04J 14/02; G02B 6/12011; G02B 6/428
USPC ........................................................ 257/177
See application file for complete search history.

(56) References Cited

U.S. PATENT DOCUMENTS

| | | | |
|---|---|---|---|
| 5,446,814 A | 8/1995 | Kuo et al. | |
| 5,485,021 A | 1/1996 | Abe | |
| 5,956,603 A | 9/1999 | Talwar et al. | |
| 6,036,956 A | 3/2000 | Jacob et al. | |
| 6,049,639 A | 4/2000 | Paniccia et al. | |
| 6,052,498 A | 4/2000 | Paniccia | |
| 6,243,508 B1 | 6/2001 | Jewell et al. | |
| 6,330,377 B1 | 12/2001 | Kosemura | |
| 6,393,169 B1 | 5/2002 | Paniccia et al. | |
| 6,403,393 B1 | 6/2002 | Adkisson et al. | |
| 6,456,765 B1 | 9/2002 | Klocek et al. | |
| 6,549,708 B2 | 4/2003 | Worchesky et al. | |
| 6,587,605 B2 | 7/2003 | Paniccia et al. | |
| 6,603,915 B2* | 8/2003 | Glebov .............. G02B 6/12004 | |
| | | | 385/129 |
| 6,731,856 B1 | 5/2004 | Fujita et al. | |
| 6,845,184 B1 | 1/2005 | Yoshimura et al. | |
| 6,996,303 B2* | 2/2006 | Glebov ................ G02B 6/1221 | |
| | | | 385/14 |
| 7,218,809 B2 | 5/2007 | Zhou et al. | |
| 7,266,262 B2 | 9/2007 | Ogawa | |
| 7,529,439 B2 | 5/2009 | Kim et al. | |
| 7,627,204 B1 | 12/2009 | Deane | |
| 8,135,248 B2 | 3/2012 | Hodono | |
| 8,368,995 B2 | 2/2013 | Dallesasse et al. | |
| 9,036,956 B2 | 5/2015 | Tseng et al. | |
| 9,086,551 B2 | 7/2015 | Heroux | |
| 9,310,575 B2 | 4/2016 | Matsuda | |
| 9,341,797 B2 | 5/2016 | Nakagawa et al. | |
| 9,627,851 B1 | 4/2017 | Zilkie | |
| 9,939,593 B2 | 4/2018 | Miao et al. | |
| 9,964,702 B1 | 5/2018 | Luo et al. | |
| 2001/0031109 A1 | 10/2001 | Paniccia et al. | |
| 2001/0038737 A1 | 11/2001 | Imada et al. | |
| 2002/0018507 A1 | 2/2002 | Deacon | |
| 2002/0028045 A1 | 3/2002 | Yoshimura et al. | |
| 2002/0036356 A1 | 3/2002 | Teshima | |
| 2002/0114587 A1 | 8/2002 | Golwalkar et al. | |
| 2003/0015770 A1 | 1/2003 | Talin et al. | |
| 2003/0223673 A1 | 12/2003 | Garito et al. | |
| 2004/0065843 A1* | 4/2004 | Schut ........................ H01J 3/02 | |
| | | | 250/398 |
| 2004/0109654 A1 | 6/2004 | Feger et al. | |
| 2004/0245538 A1 | 12/2004 | Wang et al. | |
| 2004/0264837 A1 | 12/2004 | Ogawa | |
| 2005/0031265 A1 | 2/2005 | Simon et al. | |
| 2005/0041906 A1 | 2/2005 | Sugama et al. | |
| 2005/0063636 A1 | 3/2005 | Joyner | |
| 2005/0136574 A1* | 6/2005 | Shih .................... G02F 1/13458 | |
| | | | 438/151 |
| 2005/0141808 A1 | 6/2005 | Cheben et al. | |
| 2005/0185900 A1 | 8/2005 | Farr | |
| 2005/0201707 A1 | 9/2005 | Glebov | |
| 2006/0045418 A1 | 3/2006 | Cho et al. | |
| 2007/0058976 A1 | 3/2007 | Tatum et al. | |
| 2008/0031583 A1 | 2/2008 | Ohtsu et al. | |
| 2008/0037934 A1 | 2/2008 | Daikuhara et al. | |
| 2008/0130125 A1 | 6/2008 | Goelles et al. | |
| 2008/0265416 A1* | 10/2008 | Lee ........................ H01L 21/3212 | |
| | | | 257/751 |
| 2008/0279557 A1 | 11/2008 | Park et al. | |
| 2008/0279566 A1* | 11/2008 | Miller ................ H04B 10/0799 | |
| | | | 398/162 |
| 2009/0049964 A1* | 2/2009 | Yagyu .................... B24B 13/015 | |
| | | | 83/34 |
| 2009/0060526 A1 | 3/2009 | Matsui et al. | |
| 2009/0072393 A1 | 3/2009 | Bachman | |
| 2009/0202713 A1 | 8/2009 | Pitwon | |
| 2009/0218519 A1 | 9/2009 | McLeod | |
| 2010/0032853 A1 | 2/2010 | Naitou | |
| 2010/0104290 A1 | 4/2010 | Nobuhara et al. | |
| 2010/0213561 A1 | 8/2010 | Assefa et al. | |
| 2010/0215313 A1 | 8/2010 | Matsuoka et al. | |
| 2010/0226655 A1 | 9/2010 | Kim | |
| 2011/0030778 A1 | 2/2011 | Takacs et al. | |
| 2011/0133063 A1 | 6/2011 | Ji et al. | |
| 2011/0229080 A1 | 9/2011 | Bulthuis et al. | |
| 2012/0076454 A1 | 3/2012 | Shiraishi | |
| 2012/0163821 A1 | 6/2012 | Kwon et al. | |
| 2012/0177381 A1 | 7/2012 | Dobbelaere | |
| 2012/0314990 A1 | 12/2012 | Pitwon et al. | |
| 2013/0064494 A1 | 3/2013 | Bolle et al. | |
| 2013/0182998 A1 | 6/2013 | Andry et al. | |
| 2013/0195456 A1 | 8/2013 | Sorin et al. | |
| 2013/0223789 A1* | 8/2013 | Lee ........................ G02B 6/4214 | |
| | | | 385/14 |
| 2014/0112616 A1 | 4/2014 | Numata | |
| 2014/0140657 A1 | 5/2014 | Shiraishi | |
| 2014/0177995 A1 | 6/2014 | Mohammed et al. | |
| 2014/0294342 A1 | 10/2014 | Offrein | |
| 2014/0321804 A1 | 10/2014 | Thacker et al. | |
| 2014/0355931 A1 | 12/2014 | Tummala et al. | |
| 2015/0043919 A1 | 2/2015 | Handelman | |
| 2015/0117824 A1 | 4/2015 | Wang et al. | |
| 2015/0132002 A1 | 5/2015 | Krishnamurthy et al. | |
| 2015/0168646 A1 | 6/2015 | Arai | |
| 2015/0303649 A1 | 10/2015 | Weber | |
| 2015/0333831 A1 | 11/2015 | Lai et al. | |
| 2015/0362673 A1 | 12/2015 | Zheng et al. | |
| 2015/0362676 A1 | 12/2015 | Murison et al. | |
| 2016/0011414 A1 | 1/2016 | Joseph | |
| 2016/0156999 A1 | 6/2016 | Liboiron-Ladouceur et al. | |
| 2016/0178839 A1 | 6/2016 | Tsujita | |
| 2016/0349451 A1 | 12/2016 | Shen et al. | |
| 2017/0017042 A1 | 1/2017 | Menard et al. | |
| 2017/0230117 A1 | 8/2017 | Li et al. | |
| 2018/0149815 A1 | 5/2018 | Heroux et al. | |
| 2018/0159627 A1 | 6/2018 | Fazal et al. | |
| 2018/0288875 A1 | 10/2018 | Sasaki et al. | |
| 2018/0335583 A1 | 11/2018 | Jou et al. | |
| 2018/0335584 A1 | 11/2018 | Jou et al. | |
| 2018/0335585 A1 | 11/2018 | Jou et al. | |
| 2018/0335586 A1 | 11/2018 | Jou et al. | |
| 2018/0335587 A1 | 11/2018 | Jou et al. | |

(56) References Cited

U.S. PATENT DOCUMENTS

| | | | |
|---|---|---|---|
| 2018/0335588 | A1 | 11/2018 | Jou et al. |
| 2018/0335589 | A1 | 11/2018 | Jou et al. |
| 2018/0335590 | A1 | 11/2018 | Jou et al. |
| 2018/0337743 | A1 | 11/2018 | Jou et al. |

FOREIGN PATENT DOCUMENTS

| | | |
|---|---|---|
| WO | WO 2018/213037 A1 | 11/2018 |
| WO | WO 2018/213038 A1 | 11/2018 |
| WO | WO 2018/213039 A1 | 11/2018 |
| WO | WO 2018/213040 A1 | 11/2018 |
| WO | WO 2018/213041 A1 | 11/2018 |
| WO | WO 2018/213042 A1 | 11/2018 |
| WO | WO 2018/213043 A1 | 11/2018 |
| WO | WO 2018/213044 A1 | 11/2018 |

OTHER PUBLICATIONS

U.S. Appl. No. 15/963,440, Non-Final Office Action dated Dec. 19, 2018.
U.S. Appl. No. 15/964,889, Final Office Action dated Jan. 2, 2019.
U.S. Appl. No. 15/965,213, Non-Final Office Action dated Jan. 14, 2019.
U.S. Appl. No. 15/963,030, Non-Final Office Action dated Oct. 17, 2018.
U.S. Appl. No. 15/963,030, Non-Final Office Action dated Oct. 17, 2017.
U.S. Appl. No. 15/963,665, Notice of Allowance dated Oct. 3, 2018.
U.S. Appl. No. 15/963,780, Non-Final Office Action dated Oct. 24, 2018.
U.S. Appl. No. 15/964,701, Non-Final Office Action dated Oct. 5, 2018.
WIPO Application No. PCT/US2018/031336, PCT International Search Report and Written Opinion of the International Searching Authority dated Sep. 19, 2018.
Chen et al., "Chip-Level 1 2 Optical Interconnects Using Polymer Vertical Splitter on Silieuri Substrate," IEEE Photonics Journal, 6:1-9 (2014).[ Retrieved from the Internet on Jun. 29, 2018 <URL:https://ieeexplore.ieee.org/stamp/stamp.jsp?tp=&arnumber=67.
Shen et al., "Implementation of Chip-Level Optical Interconnect With Laser and Photodetector Using SOI-Based 3-D Guided-Wave Path", IEEE Photonics Journal, 6:1-9, (2014).
Shen et al., "Chip-Level Optical Interconnects Using Polymer Waveguides Integrated With Laser-PD on Silicon," IEEE Photonics Technology Letters, (27):13, (2015). [Retrieved from the Internet on Mar. 7, 2018 <URL: https://ieeexplore.Ieee.org/abstract/docu.
U.S. Appl. No. 15/963,043 , Requirement for Restriction-Election dated Jun. 29, 2018.
U.S. Appl. No. 15/963,440 Requirement for Restriction-Election dated Jul. 10, 2018.
U.S. Appl. No. 15/963,780, Requirement for Restriction-Election dated Jul. 27, 2018.
U.S. Appl. No. 15/964,889, Non-Final Office Action dated Jun. 27, 2018.
WIPO Application No. PCT/US2018/031328, PCT International Search Report and Written Opinion of the International Searching Authority dated Jul. 26, 2018.
WIPO Application No. PCT/US2018/031331, PCT International Search Report and Written Opinion of the International Searching Authority dated Jul. 26, 2018.
WIPO Application No. PCT/US2018/031332, PCT International Search Report and Written Opinion of the International Searching Authority dated Jul. 26, 2018.
WIPO Application No. PCT/US2018/031333, PCT International Search Report and Written Opinion of the International Searching Authority dated Jul. 26, 2018.
WIPO Application No. PCT/US2018/031334, PCT International Search Report and Written Opinion of the International Searching Authority dated Jul. 26, 2018.
WIPO Application No. PCT/US2018/031335, PCT International Search Report and Written Opinion of the International Searching Authority dated Sep. 12, 2018.
WIPO Application No. PCT/US2018/031338, PCT International Search Report and Written Opinion of the International Searching Authority dated Jul. 31, 2018.
WIPO Application No. PCT/US2018/031343, PCT International Search Report and Written Opinion of the International Searching Authority dated Jul. 31, 2018.
WIPO Application No. PCT/US2018/031345, PCT International Search Report and Written Opinion of the International Searching Authority dated Jul. 26, 2018.
U.S. Appl. No. 15/964,889, Notice of Allowance dated Mar. 21, 2019.
U.S. Appl. No. 15/963,043, Requirement for Restriction-Election dated Feb. 25, 2019.
U.S. Appl. No. 15/963,014, Non-Final Office Action dated Mar. 29, 2019.
U.S. Appl. No. 15/963,014, Notice of Allowance dated Jul. 2, 2019.
U.S. Appl. No. 15/963,030, Final Office Action dated May 15, 2019.
U.S. Appl. No. 15/963,030, Notice of Allowance dated Jul. 16, 2019.
U.S. Appl. No. 15/963,043, Non-Final Office Action dated Jun. 27, 2019.
U.S. Appl. No. 15/963,440, Final Office Action dated Apr. 23, 2019.
U.S. Appl. No. 15/963,440, Non-Final Office Action dated Jun. 6, 2019.
U.S. Appl. No. 15/963,780, Non-Final Office Action dated Apr. 25, 2019.
U.S. Appl. No. 15/963,780, Notice of Allowance dated Sep. 17, 2019.
U.S. Appl. No. 15/964,701, Final Office Action dated May 2, 2019.
U.S. Appl. No. 15/964,701, Non-Final Office Action dated Jun. 14, 2019.
U.S. Appl. No. 15/965,213, Notice of Allowance dated Jun. 5, 2019.
U.S. Appl. No. 15/963,043, Notice of Allowance dated Nov. 4, 2019.
U.S. Appl. No. 15/963,440, Final Office Action dated Oct. 3, 2019.

* cited by examiner

OPTICAL INTERCONNECT MODULES WITH POLYMER WAVEGUIDE ON SILICON SUBSTRATE

CROSS REFERENCE TO RELATED APPLICATIONS

This application claims the benefit of U.S. Provisional Patent Applications No. 62/508,940, titled "OPTICAL COUPLING STRUCTURE" filed on May 19, 2017, and No. 62/509,892, titled "OPTICAL INTERCONNECT MODULES" filed on May 23, 2017, which are incorporated by reference herein in their entirety.

FIELD

Embodiments described herein relate to optical interconnect modules, and more particularly optical sub-assembly systems in optical interconnects.

BACKGROUND

Cloud computing, enterprise networks, and data center networks continue to drive increased bandwidth demand of optical waveguides for metro and long haul wires, and also rack-to-rack wires within data centers to 100 Gbps and beyond. Increased bandwidth demand has motivated overall high data transmission speed on entire optical systems.

Optical interconnect techniques continue to gain attention as potential solutions for high-speed data transmission between systems, and over a variety of distances. For example, optical interconnect solutions have been proposed for a number of applications, such as between racks in a data center, between household consumer electronics, and between boards or chips within server systems. Optical interconnects are particularly suitable for adoption within transmitter and receiver systems.

In a conventional optical sub-assembly (OSA) design, a transmitter module includes a transmission laser, a driver integrated circuit (IC), and a printed circuit board (PCB), while a receiver module includes a photodetector (PD), a trans-impedance amplifier (TIA), and a PCB. The optical path between the transmission laser (commonly a vertical cavity surface emitting laser (VCSEL)) and PD is typically an optical fiber, such as a fiber ribbon and optical waveguides. Complex beam routers including a focusing lens, a prism, and a fiber connector are used to precisely align the optical fiber with the optical path. Mechanical structures including screws, clips, alignment pins and structural housing are commonly used to secure and align the beam routers.

However, an optical interconnect typically requires coupling of fiber assembly and lasers which involves an external lens alignment, adding complexity and energy loss. A less complicated assembly technique is needed to improve efficiency and reduce cost.

SUMMARY

The application discloses a silicon substrate based optical interconnect module which includes a trench, having a first and a second slanted side walls opposite to each other, a number of polymer waveguides formed in the trench, each waveguide includes a straight portion and two end reflectors formed on the slanted side walls of the trench, a light source and an optical receiver disposed on an insulated layer on the silicon surface outside the trench. The polymer waveguides are employed to connect the optical signal between the light source and the receiving devices. Conductive lines are patterned on the insulating layer and connect to the light source and the optical receiver. The light source and the optical receiver are aligned respectively to the two end reflectors of each polymer waveguide such that an optical path is formed from the light source device through the plurality of polymer waveguides to the optical receiver device, via reflection by the two end reflectors.

Optionally, the polymer waveguides include a polymer cladding layer disposed on the trench's bottom covering the first and second slanted side walls, and a polymer core layer disposed on the polymer cladding layer, wherein a refractive index of the polymer cladding layer is lower than a refractive index of the polymer core layer such that total internal reflection occurs when light travels inside the polymer waveguides.

Optionally, the first slanted side wall of the trench has a slanted angle approximately set at 45 degrees to align optically to the light source device.

Optionally, the second slanted side wall of the trench has a slanted angle approximately set at 45 degrees to align optically to the optical receiver device.

Optionally, the light source device comprises a vertical cavity surface emission laser (VCSEL), or a vertical cavity surface emission laser array (VCSELs) emitting infrared light. Optionally, the optical receiver device is a photodiode (PD) or a photodiode array (PDs).

Optionally, the silicon substrate has a thickness ranging from 50 microns to 2 mm.

Optionally, the light source device and the optical receiver device are respectively connected to the plurality of conductive lines by solder bumps.

Optionally, the conductive lines are made of one of tungsten (W), aluminum (Al), copper (Cu), gold (Au), silver (Ag), stainless steel, or an alloy.

Optionally, the conductive lines are high speed RF transmission lines capable of operating at 25 Gbps per channel.

The application also discloses a method of fabricating an optical interconnect apparatus according to one embodiment. The method comprises: providing a silicon substrate having a top silicon surface; forming a trench on the top silicon surface; patterning a first and a second slanted side walls of the trench, wherein the first and second slanted sidewalls are opposite to each other; forming a plurality of polymer waveguides in the trench by depositing a first polymer cladding layer in the trench covering the first and second slanted side walls, followed by depositing a polymer core layer on the first polymer cladding layer, patterning the polymer core layer and covering the patterned polymer core layer with a second polymer cladding layer, wherein the plurality of polymer waveguides each has one straight portion and two slanted end reflectors; depositing an insulating layer on the silicon top surface outside the trench; patterning conductive lines in the insulating layer; growing solder bumps on conductive lines for flip chip mounting with bond pads; connecting a light source device with one of the conductive lines near the first slanted side wall of the trench and an optical receiver device with another one of the conductive lines near the second slanted side wall of the trench; and aligning the light source device and the optical receiver device with the slanted end reflectors of the plurality of polymer waveguides.

Optionally, the light source device comprises a vertical cavity surface emitting laser (VCSEL) and wherein the optical receiver device comprises a photodetector (PD).

Optionally, the patterning the first and second slanted side walls of the trench comprises applying a variable lithography exposure energy to achieve smooth and accurate slanted angles.

Optionally, the slanted end reflectors have approximately 45 degree slanted angles.

Optionally, patterning the conductive lines comprises forming trenches and filling in metal in the trenches, followed by removing excess metal by polishing (CMP) or by selective etch to clean up metal outside the trenches.

Optionally, patterning the conductive lines comprises depositing a metal layer, patterning the metal layer into lines by selective etch, or laser writing.

Optionally, the metal layer may be aluminum, tungsten, etc. If it is copper, process will need to apply copper plating techniques.

BRIEF DESCRIPTION OF THE DRAWINGS

Having thus described some embodiments in general terms, reference will now be made to the accompanying drawings, which are not necessarily drawn to scale.

DETAILED DESCRIPTION

The present disclosure is further described below in combination with the drawings and embodiments. It should be understood that, the specific embodiments described herein are merely used to explain the present disclosure rather than limiting the present disclosure. In addition, it should be stated that, in order to facilitate the description, merely a part of structures related to the present disclosure rather than the whole structure are illustrated in the drawings.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

It needs to be noted that, specific details are illustrated in the description below for fully understanding the disclosure. However, the disclosure can be implemented in other ways different from those described herein, and it may be similarly generalized by one skilled in the art without departing from the concept of the disclosure. Therefore, the disclosure will not be limited to the specific embodiments disclosed below.

Optical interconnect is a means of communication by optical modules. Optical communication systems often apply a vertical-cavity surface-emitting laser VCSEL for convenient configurations and easy assembling.

The vertical-cavity surface-emitting laser, or VCSEL is a type of semiconductor laser diode with laser beam emission perpendicular from the top surface, contrary to conventional edge-emitting semiconductor lasers (also in-plane lasers) which emit from surfaces formed by cleaving the individual chip out of a wafer. Vertical cavity self-emitting laser or VCSEL laser emitting light at wavelengths from 650 nm to 1300 nm are typically based on gallium arsenide (GaAs) wafers with diffraction Bragg reflectors (DBRs) formed from GaAs and aluminum gallium arsenide ($Al_xGa_{(1-x)}As$).

There are now two main methods of restricting the current in a VCSEL characterized by two types of VCSELs: ion-implanted VCSELs and Oxide VCSELs. An additional adhesive layer, such as a non-conductive film (NCF), may also be applied to enhance adhesion of the components to the silicon substrate. The adhesive layer can be made from an organic film such as polyimide. The high speed conductive lines, including an RF transmission devices, are designed on the same surface as the polymer waveguides to connect the driver IC and VCSEL arrays as well as to connect transimpedance amplifier (TIA) arrays. Typically a VCSEL array has four VCSEL lasers packed in a row.

In accordance with an embodiment, the data rate of the optical engine can be operated at 25 Giga-bits per second (Gbps) per channel, and can be extended to higher data rates such as 50 Gbps per channel. VCSEL applications include fiber optic communications, precision sensing, computer mice and laser printers.

Embodiments disclosed below describe optical interconnects and application platforms. In one aspect, the optical interconnects and platforms in accordance with embodiments may be assembled without the optical lenses and fiber ribbons commonly utilized in conventional optical interconnect assemblies. Assembly time can be reduced compared to conventional techniques through use of semiconductor process technologies for the formation of conductive transmission lines and flip chip integration of the active optical devices such as the driver IC chip, lasers, PD, and receiver (e.g. TIA) chips. In addition, the fabrication techniques may allow for improved RF performance of the electrical signals and increased data rates of the optical interconnects. The embodiments illustrated below may be integrated as a PCB-based optical interconnect. In particular, the embodiment may be utilized to improve optical coupling with the VCSEL/PD by monolithically integrating a silicon wafer interposer with a VCSEL laser within a packaging platform like PCB, and a polymer waveguide.

Figure 1:
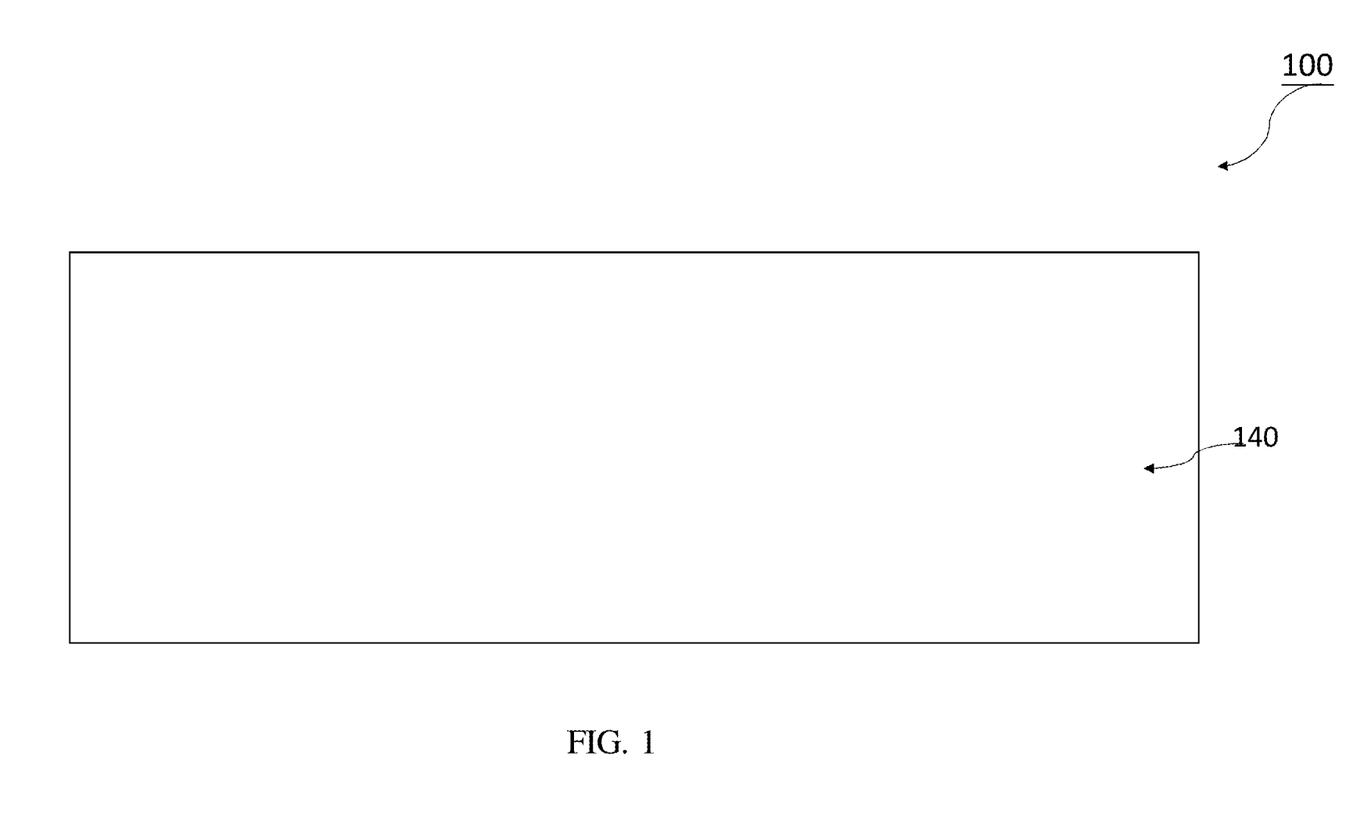
FIG. 1 illustrates a silicon substrate.

As shown in FIG. 1, substrate 100 has a silicon surface 140. The thickness of the silicon substrate 140 is chosen to be thin so it is light and yet has enough strength to support photonics elements on the top surface during its fabrication process and in its long term operation. Typically the thickness is in the range of 50 microns to 2 millimeters.

Figure 2:
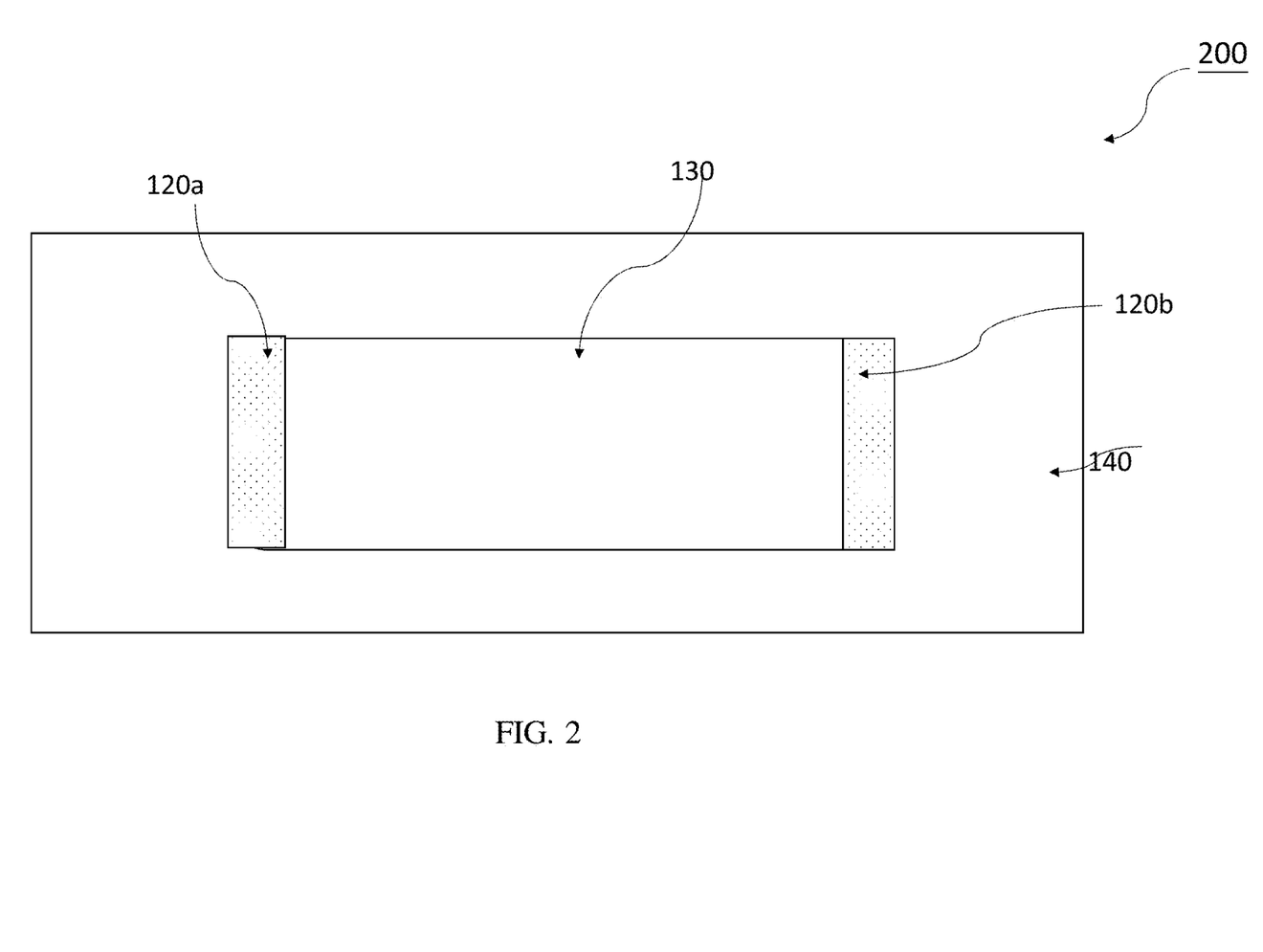
FIG. 2 shows a top view of a trench having two slanted side walls made on the silicon substrate in accordance with an embodiment.

FIG. 2 shows a top view of a trench, which has two opposite slanted side walls formed on the top surface of the silicon substrate in accordance with an embodiment. The trench 130 has an elongated shape, likely a rectangular. The length of the trench 130 accommodates the length of the polymer waveguides. The width of the trench 130 allows the full array of waveguides to be packed inside the trench. The depth of the trench 130 allows to accommodate at least the full package of the polymer waveguides. This depth can vary from a few microns to one millimeter. The opposite side walls 120a and 120b are built as slanted slopes upon which the ends of the polymer waveguides lie. The slanted angles should be close to but are not exactly 45 degrees in order to easy align with the light source and optical receiver. The two slanted angles of the two side walls don't have to be equal either. To make the elongated trench and the slanted side walls, a number of patterning techniques can be used. Photolithography commonly applied in CMOS process technology provides various ways in controlling the lithography exposure energy to achieve smooth and accurate slant slopes. For example, a moving exposure shutter or a shrinking window during photo-exposure or a variable scanner light intensity during exposure are available techniques. Reflector angle control tolerance and surface smoothness are critical to optical energy efficiency, therefore fabrication in this step should have appropriate requirements.

Figure 3:
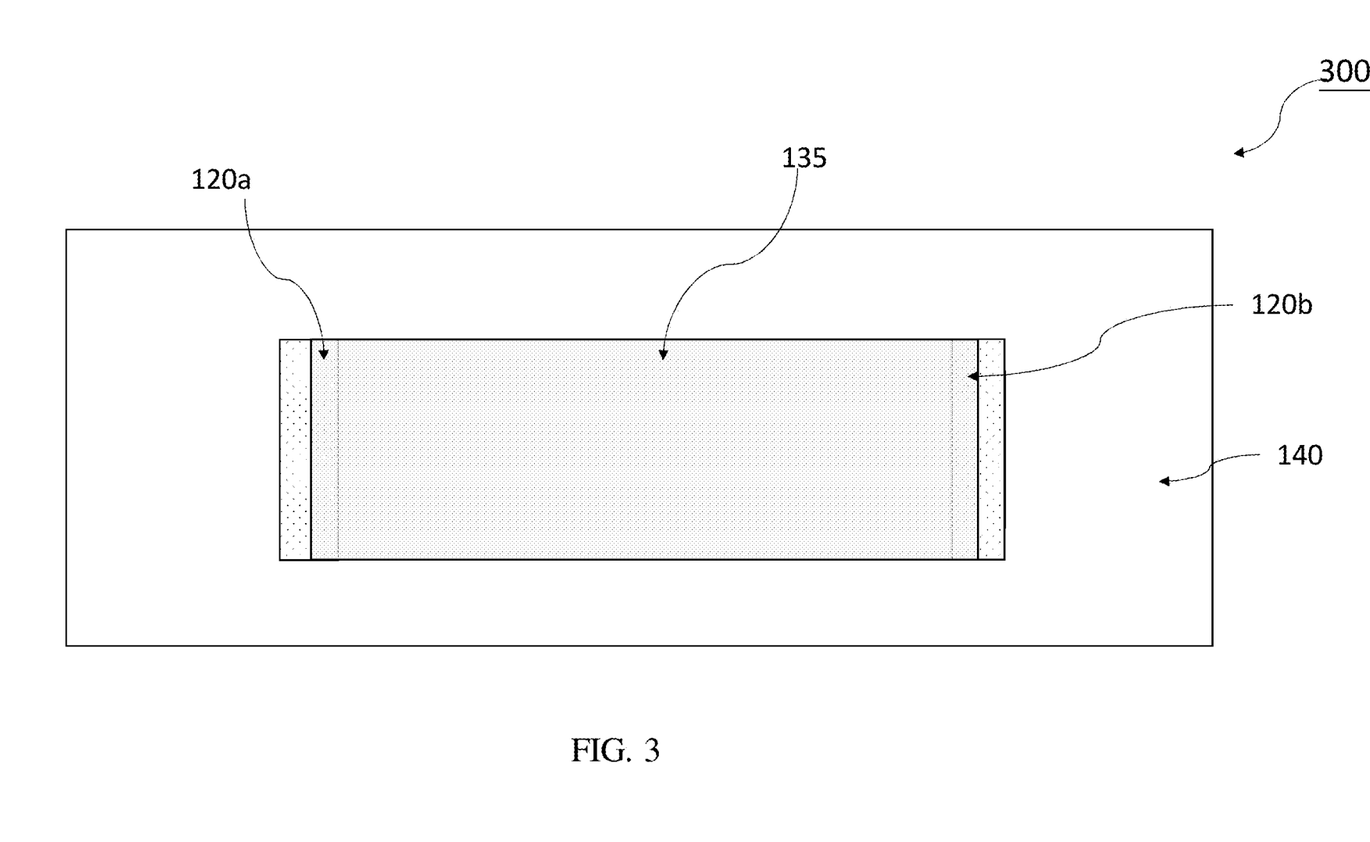
FIG. 3 shows a top view of a polymer layer formed in the trench in accordance with an embodiment.

FIG. 3 shows a top view 300 of a polymer layer 135 formed in the trench 130 in accordance with an embodiment. It is another preparation step to form an optical passive path, i.e. the polymer waveguides, inside the trench. Although in many optical interconnect modules, a waveguide may be formed separately first and attached to one surface of a substrate later, using an adhesive layer, this application discloses a polymer waveguide fabricated directly on the silicon substrate. As an integrated part of the substrate, the polymer waveguide enables low optical coupling loss at interfaces and stable alignment along the optical path. Meanwhile, fabrication cost from attaching waveguides to an interposer is much reduced. The polymer layer 135 is formed in the trench which typically includes a polymer cladding layer having a thickness in the range of one to 50 microns and a polymer core layer on the polymer cladding layer. The polymer core has a thickness ranging from a few microns for single mode light to hundreds of microns for multi-mode waveguides. It is also possible to deposit only one layer of polymer as the core without a special cladding layer surrounding the core. However thus produced polymer waveguide may not be optically efficient. Polymers include PMMA, polyimide, and other optical quality polymer materials. It typically includes two polymer materials for core and for cladding which have distinguishable refractive indices at the working wavelengths. Cladding generally is made of silicone (index ~1.46), core made of PMMA or polyimide which has index in range of 1.49 and 1.59. The slanted trench side walls 120a and 120b are covered at least partially by both the cladding and the core layers.

Figure 4:
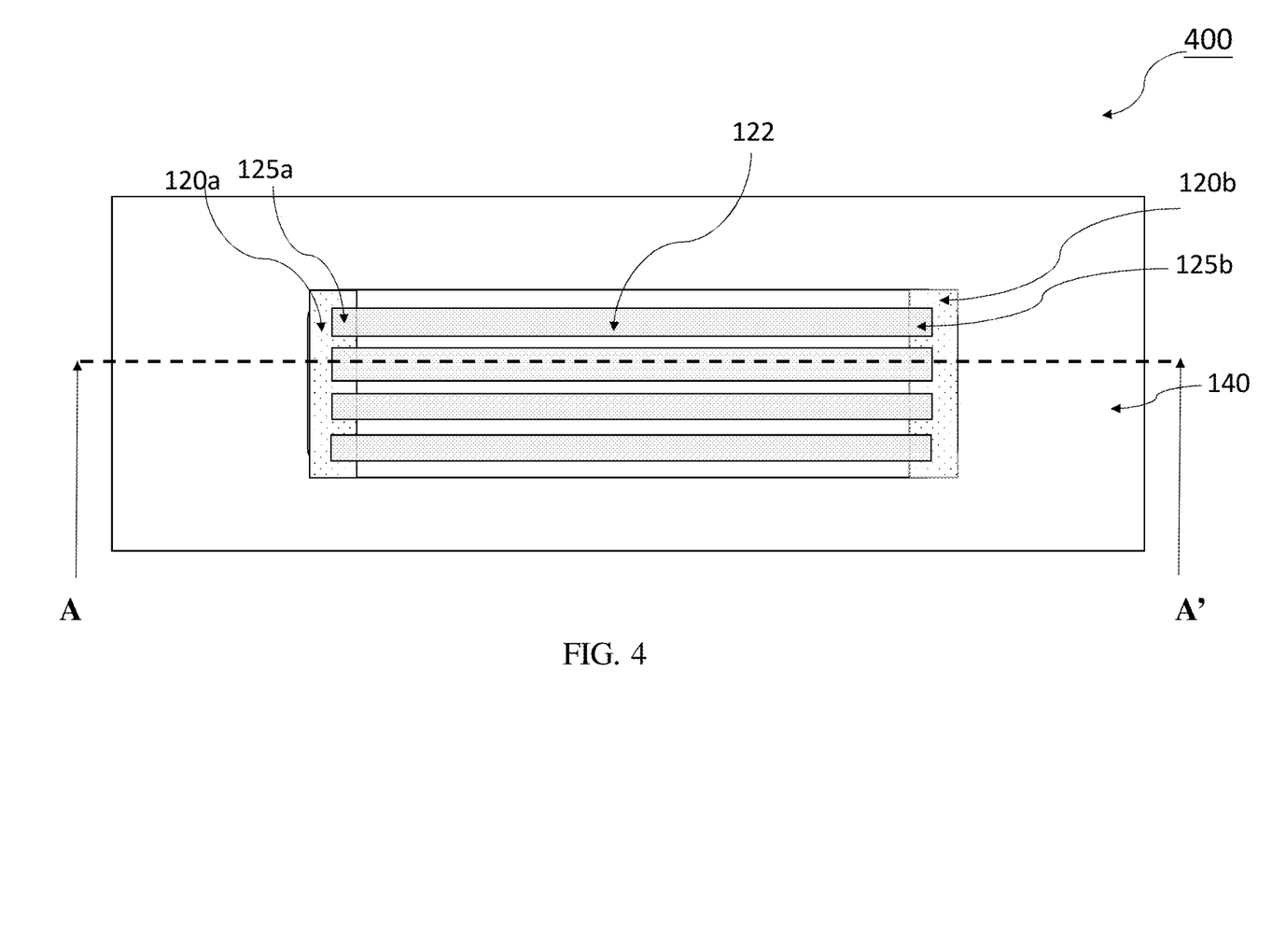
FIG. 4 illustrates a top view of an array of polymer waveguides fabricated in the silicon trench in accordance with an embodiment.

FIG. 4 illustrates a top view of an array of polymer waveguides fabricated in the silicon trench in accordance with an embodiment. As shown in the diagram 400 in FIG. 4, the polymer layer is patterned into strip shaped parallel polymer waveguides 122 sitting in the trench of the silicon substrate 140. Each waveguide 122 has two ends resting on the slanted side walls 120a and 120b, thus forming slanted interfaces 125a and 125b. The resultant slanted interfaces must meet high optical quality requirements such as good high frequency roughness and low light scattering. Patterning techniques include lithography and laser writing. If there is a polymer cladding layer, a different polymer material should be deposited below the core polymer layer and also deposited on and around the core waveguides after patterning the waveguides so each of the waveguides 122 is surrounded by the cladding polymer layers. Each polymer strip has width around 4-6 microns for a single mode waveguide, or in a range of 10 to hundreds of microns for a multi-mode waveguide. This patterning step is performed using lithography technique and selective etch so the polymer is removed but the underlining silicon is intact.

Figure 5:
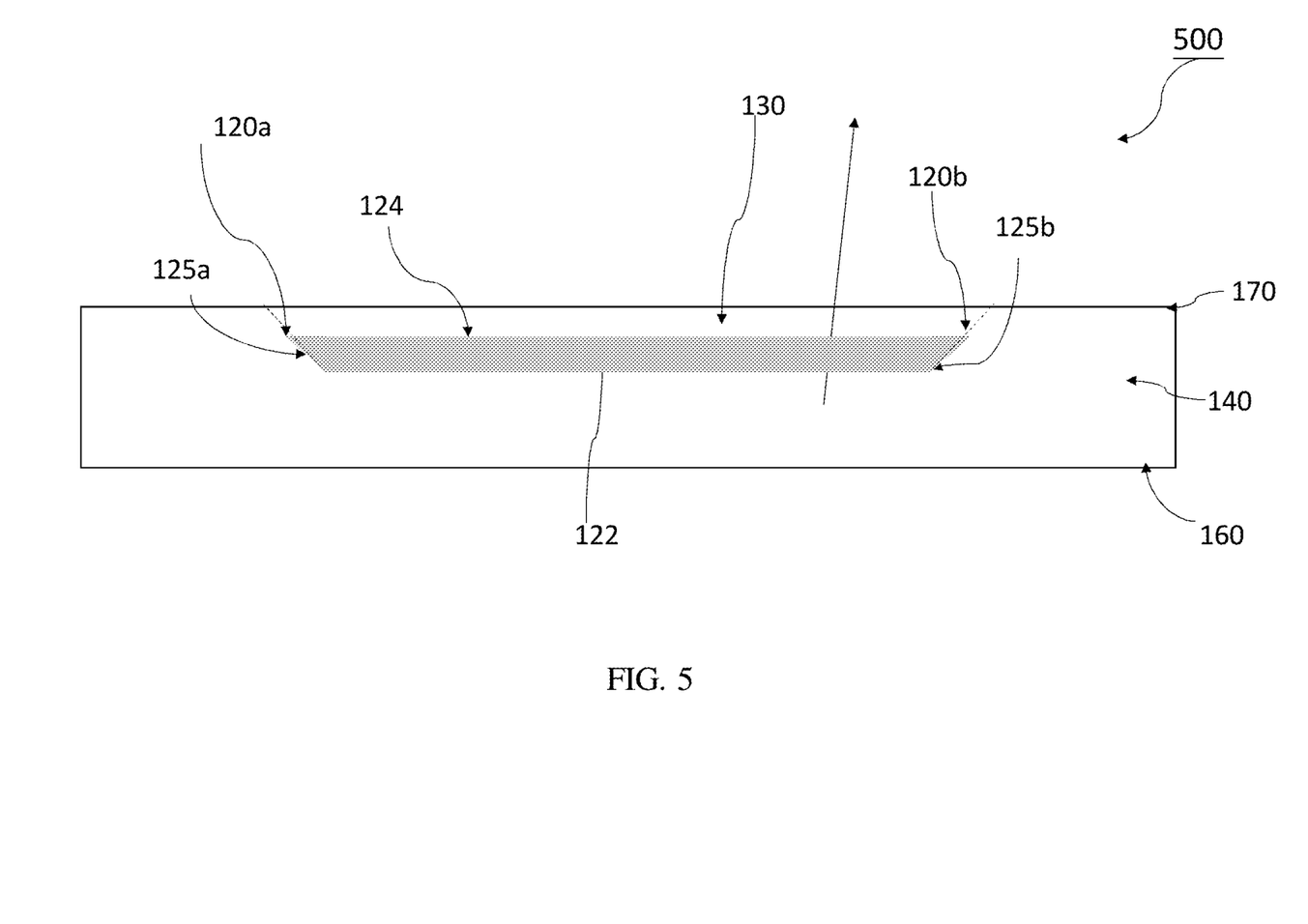
FIG. 5 illustrates a cross sectional view of a polymer waveguides in the silicon trench along a line AA' in FIG. 4 in accordance with an embodiment.

FIG. 5 illustrates a cross sectional view of an array of polymer waveguides in the silicon trench along a line AA' in FIG. 4 in accordance with an embodiment.

As shown in FIG. 5, diagram 500 has a silicon substrate 140, a bottom surface 160 and a top surface 170 where the optical interconnector is built. The silicon trench 130 opens a space for disposing the polymer waveguides 122. Each of the waveguides 122 has two end reflective surfaces 125a and 125b interfacing the two slanted side walls 120a and 120b of the silicon trench 130. A polymer cladding material (not shown) is typically disposed wrapping around the waveguide 122 on its bottom surface, top surface, side walls, and the slanted interfaces in order to have uniformly matched refractive index difference.

Each of the waveguides in FIG. 5 has a straight portion 124 and two slanted ends 125a and 125b. Often the slanted angle is made into 45 degrees for easy alignment, but it can be formed different than 45 degrees and the two slanted ends may have different angles. As an exemplary embodiment, both ends 125a and 125b are referred to as 45 degree reflectors in this description. The waveguide ends serve like 45 degree bending mirrors. Light comes from an input device above the slanted end 125a at one side of the trench gets reflected 90 degrees into the horizontal portion 124, light then travels through the waveguide by total internal reflection, hits the second end interface 125b, gets reflected off by the second 45 degree reflector, changes trajectory up and returns back to the output receiver device over the other side of the trench.

If no designated cladding layer is included in the polymer waveguide, it is recommended to seal the waveguide hermetically with a stable material to protect the waveguides. The passivating layer should have a refractive index lower than that of the polymer core to guarantee total light internal reflection.

Figure 6:
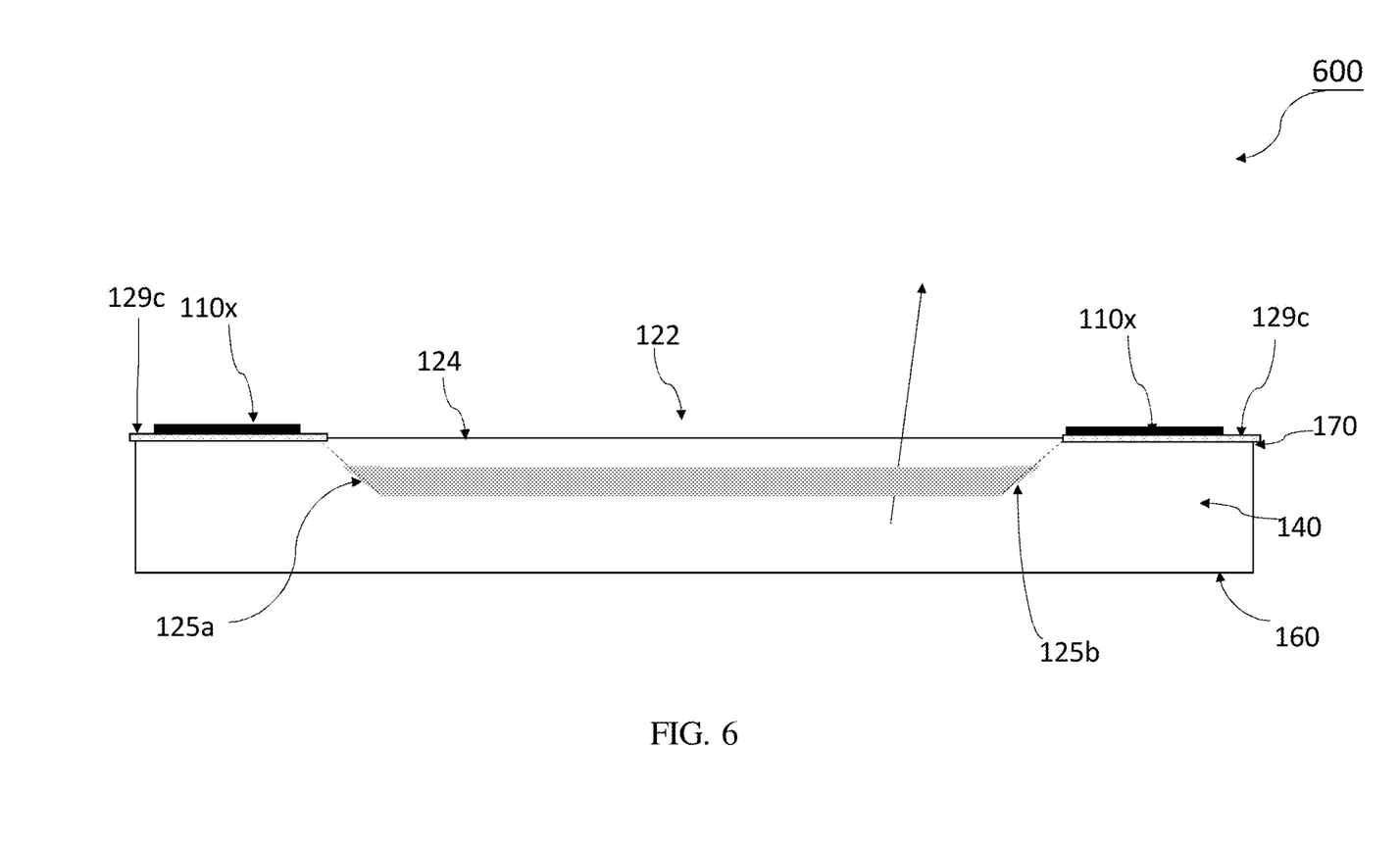
FIG. 6 shows a cross sectional view after making contact lines for active device on the silicon substrate in accordance with an embodiment.

FIG. 6 shows a cross sectional view after making contact lines on the silicon substrate in accordance with an embodiment. Conductive lines are formed on the left of the trench for optical input and on the right for optic output on the silicon top surface in FIG. 6. Because silicon is a semiconductor, an insulating film 129c has to be deposited first before any electronic devices are laid down. The insulating film 129c is either deposited or grown on the silicon surface 170 outside the trench 130. The surface 170 is a platform to carry interconnects for active optical devices, such as laser diodes in a transmitter or photodetectors in a receiver, IC drivers, amplifiers, and other electronic devices. Polymer waveguides in the trench are located on the same side of the substrate, so there will be no device disposed on the other side 160 of the silicon substrate. The waveguides are fabricated together with interconnecting the optical devices, there will be no bonding step to integrate a separate waveguide. Because there is not a substrate flip-over step to change the working surface when a holder stage holds the work piece during fabrication, therefore fabrication is more straightforward and there is less risk to damage the devices from stage changing sides.

As shown in FIG. 6, first, contact lines 110x (various transmission lines) are patterned on the insulation layer 129c on the top silicon surface 170. Please note that in FIG. 6, transmission lines are not all drawn or labeled. Metals like copper, aluminum, tungsten, titanium, or alloys can be chosen for high speed transmission lines. Metal layer deposition techniques known in the semiconductor industry can be applied. These deposition techniques include, but not limited to, sputtering of metal, followed by wet/dry etch, metal plating, or laser writing. Other line forming techniques can also be applied, for example, first form trenches into the top surface of the insulating layer; second, deposit a metal layer on the trenches, followed by a planarization technique like chemical mechanical polishing (CMP) or selective dry/wet etching to remove the excess metal from areas outside the trenches.

In accordance with the embodiments, formation of the electrical traces 110x on the substrate may lead to improved RF signal performance from the high dielectric constant of the silicon material, typically ranging in 3 to 4 for infrared light. The resultant data rate of the optical device goes up to 25 Giga-bits per second (Gbps) per channel, and can be extended to even higher data rates such as 50 Gbps per channel.

Figure 7:
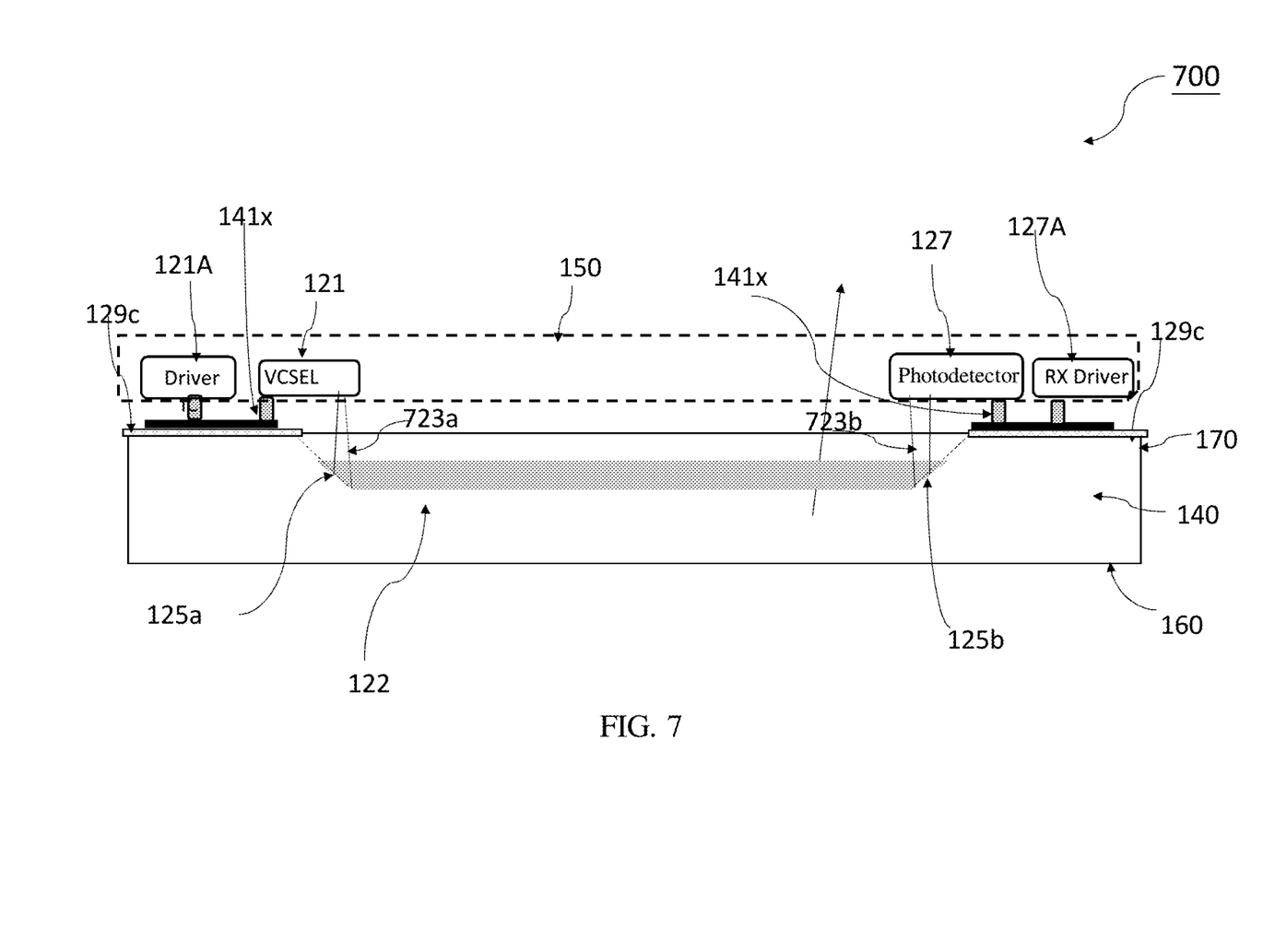
FIG. 7 illustrates adding solder bumps and active devices on the silicon substrate in accordance with an embodiment.

FIG. 7 illustrates positioning bonding pillars on conducting lines and connecting the solder bumps to active photonic devices on the silicon substrate in accordance with an embodiment. Shown in FIG. 7 a diagram 700 illustrates that proper bonding pillars 141x, made by solder bumps, are formed on the transmission lines as contacting spots for connecting to active optical devices and IC drivers or other electronics. Again not all bonding pillars are shown as 141x in FIG. 7.

Active optical devices in the input side such as vertical cavity surface emission laser (VCSEL) 121, laser driver 121A, and active optical devices in the output side such as photodiode (PD) 127, receiver driver 127A, trans-impedance amplifier (TIA not shown in the figure), RF circuits (not shown in FIG. 7), and other electronic devices are attached to transmission lines 110x engraved as metal-in-insulator structures on the top surface of the silicon substrate. Other optoelectronic devices maybe assembled on a PCB unit 150 packaged to the silicon surface. As stated above, direct patterned transmission lines on the surface enables high speed performance.

An insulation is necessary between the active devices and the conductive lines except at locations the pillars/bumps connect to the active devices. A room temperature adhesion film such as one made of polyimide maybe deposited over the transmission lines 110x and interconnecting pillars/bumps 141x to insulate them from the above active devices, leaving only the contact spots to the active devices unblocked. Another way to insulate is to apply a thermally curable or UV curable non-conductive film (NCF) over the top surface followed by heating or UV shining to enhance adhesion of the parts. A cleaning process is also applied to ensure the bonding pillars 141x properly connect to the active devices. The adhesion film or NCF is not shown in FIG. 7.

The above described optoelectronics assembly including the interconnections forms an optical engine. The optical engine is assembled to external circuits packaged through bond pads on a PCB 150. In some cases, the optical engine is assembled with a flexible printed circuit board (FCB). In an embodiment, the optical engine is assembled within a periphery of an opening in the PCB. While not separately illustrated, such a configuration is compatible with other embodiments, including that described with regard to FIG. 7.

In FIG. 7, VCSEL laser output beam is aligned to match the first 45 degree reflector 125a along path 723a, the beam changes trajectory 90 degree by the reflector 125a which couples light beam to the straight portion of waveguides 122. Light is reflected the second time by the second 45 degree reflector 125b which is aligned to photodetector 127, changes trajectory again, travels along 723b back into photodetector 127, thus completing the full optical path as shown in FIG. 7.

The completed optical interconnect system rests on the silicon substrate 140 which provides a mechanical support structure for a PCB or FCB 150 on which other bonding pads and external form factors may reside. Without the silicon substrate as an interposer, it may be too fragile to depend on PCB film to hold the photonic devices and the arrays of waveguides during manufacturing and in long term operation.

Another embodiment includes attaching a metal plate to the silicon substrate to strengthen the interposer. The metal plate is made of some compatible materials such as stainless steel.

Anisotropic conductive film (ACF) has been widely used in for higher signal densities and smaller overall packages, ideal for optoelectronic end products. In this process, the anisotropic material, for example, a thermosetting resin containing conductive particles, is first deposited on the PCB using a lamination process. The optical engine on the silicon substrate is then placed in position over the PCB and the two sides are pressed together to mount the optical engine to the PCB board. In many cases this mounting process is done with no heat or a minimal amount of heat that is just sufficient to cause the anisotropic material to become slightly tacky. In using a thermosetting resin containing conductive particles, the particles are trapped between the PCB and the optoelectronics elements, thereby creating an electrical connection there between. In other locations where it is not terminated with electrodes, particles are insulated by the thermosetting resin. For bonding, the amount of thermal energy required is higher due to the need to first flow the adhesive and allow the two sides to come together into electrical contact, and then to cure the adhesive and create a lasting reliable bond. The temperatures, times, and pressure required for these processes must be controlled properly.

Figure 8:
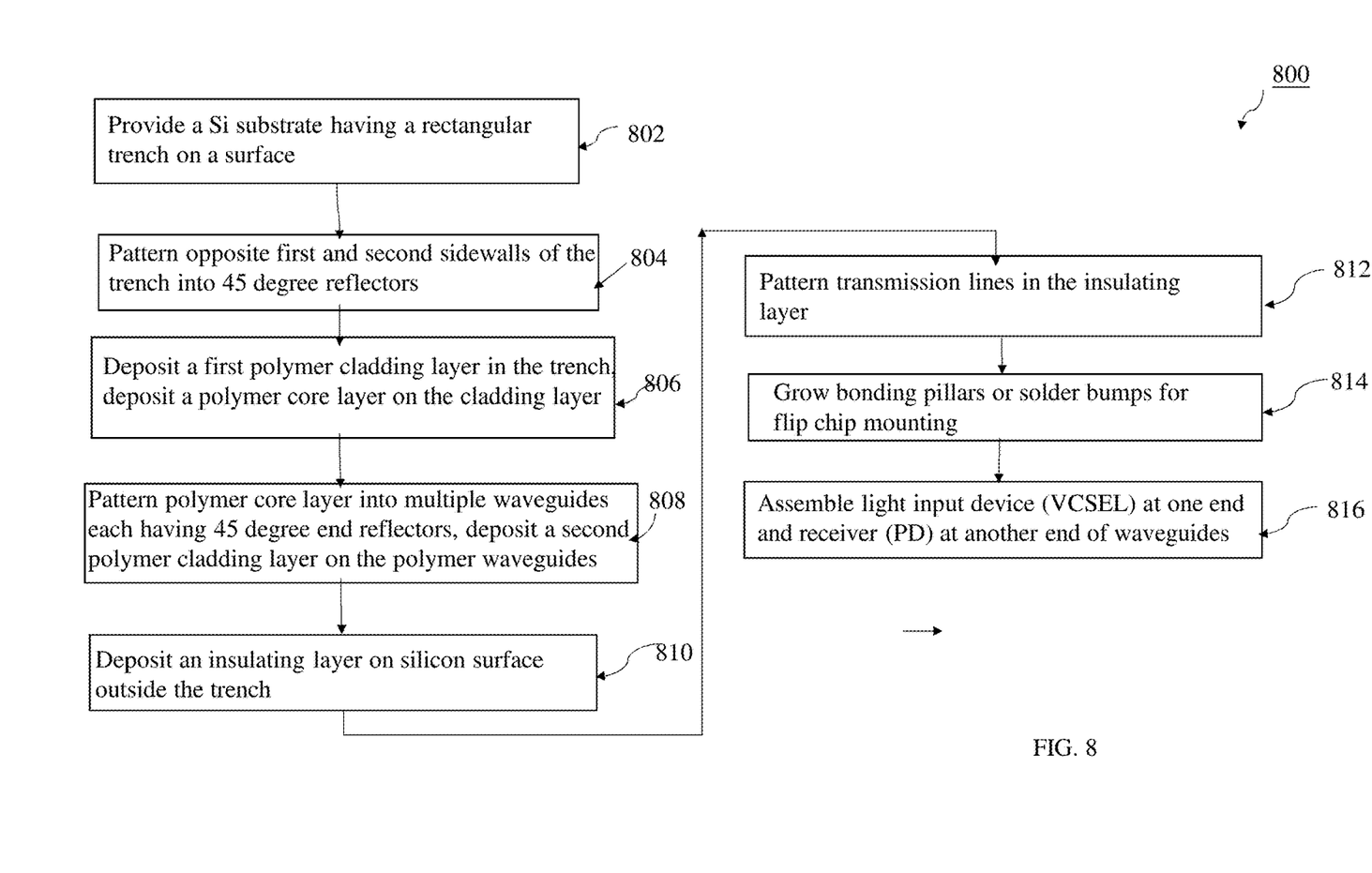
FIG. 8 is a schematic diagram of a flow chart illustrating a method for fabricating the optical interconnect module in accordance with an embodiment.

FIG. 8 is a schematic diagram of a flow chart 800 illustrating a method for fabricating the optical interconnect module with polymer waveguide in a silicon substrate in accordance with an embodiment.

The fabrication sequence may include the first step 802: provide a silicon substrate having a top silicon surface for both polymer waveguides and active input and output devices, and a bottom silicon surface as a support holder. A trench is made on the top silicon surface for positioning the waveguides. In step 804, pattern the first and second sidewalls of the trench to be reflective slanted surfaces. The slanted first and second sidewalls are opposite to each other. The slanted angles of the first and second sidewalls form a desired optical path, it is exemplary 45 degrees for both but they are not necessarily the same and they don't have to be 45 degrees.

To make the elongated trench and the slanted side walls, a number of ways in controlling the lithography exposure energy can be applied to achieve smooth and accurate slant slopes. For example, a moving exposure shutter or a shrinking window during photo-exposure or a variable scanner light intensity during exposure are available techniques. Reflector angle control tolerance and surface smoothness are critical to optical path efficiency, therefore fabrication of this step should have appropriate speciation requirements. Advanced micro patterning technology can provide such capability today.

In step 806, deposit a polymer layer in the trench, covering part of the slanted slopes. If a core polymer layer and a cladding polymer layer are desired, first deposit the cladding polymer at the bottom of the trench and the slanted slope, then cover the cladding polymer layer with the core polymer layer. In step 808, pattern polymer core layer into multiple waveguides each having 45 degree end reflectors, deposit a second polymer cladding layer on the polymer waveguides. The width of each waveguide can be from 5 microns for a single mode waveguide to a large one up to 500 microns for a multi-mode waveguide. The ends of the waveguide rest on the slanted sidewalls of the silicon trench, forming reflectors. If a cladding layer is desired, deposit the cladding material to wrap around the waveguides by covering top to inter-waveguide gap. In step 810, deposit an insulating layer on silicon surface outside the trench to form base for photonic device interconnections. In step 812, pattern transmission lines in the insulating layer. One way to form transmission lines is to pattern trenches on insulating layer and fill in metal to form transmission lines, or another way is to deposit metal layer and pattern it into lines with etching or Laser writing is also a way to get lines formed. The metal layer may be aluminum, tungsten, stainless steel, etc. If it is copper, process will need to follow copper plating techniques. In step 814, grow bonding pillars, for example, as solder bumps for flip chip mounting with bond pads. In step 816, assemble active optical devices (VCSEL/PD) with transmission lines via interconnecting pillars/solder bumps.

Figure 9:
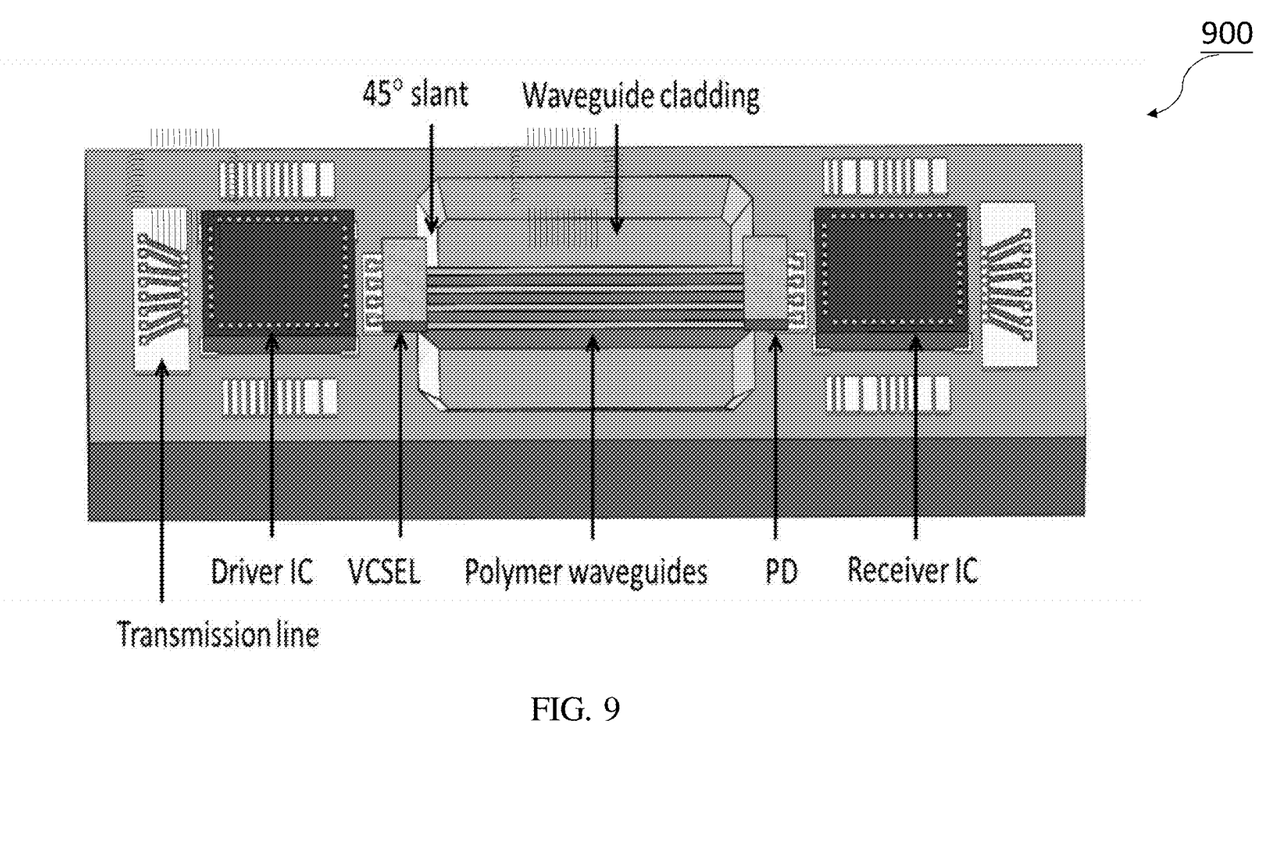
FIG. 9 shows an examplenary optical module having a polymer waveguide interconnected with a transmitter and a receiver from the same surface of a silicon substrate in accordance with the disclosed embodiment.

FIG. 9 shows an examplenary optical module having an array of polymer waveguides interconnected with a transmitter including a VCSEL laser on the left side of the waveguides, and a receiver including a photodetector on the right side of the waveguides, on the same surface of a silicon substrate in accordance with the disclosed embodiment.

Figure 10:
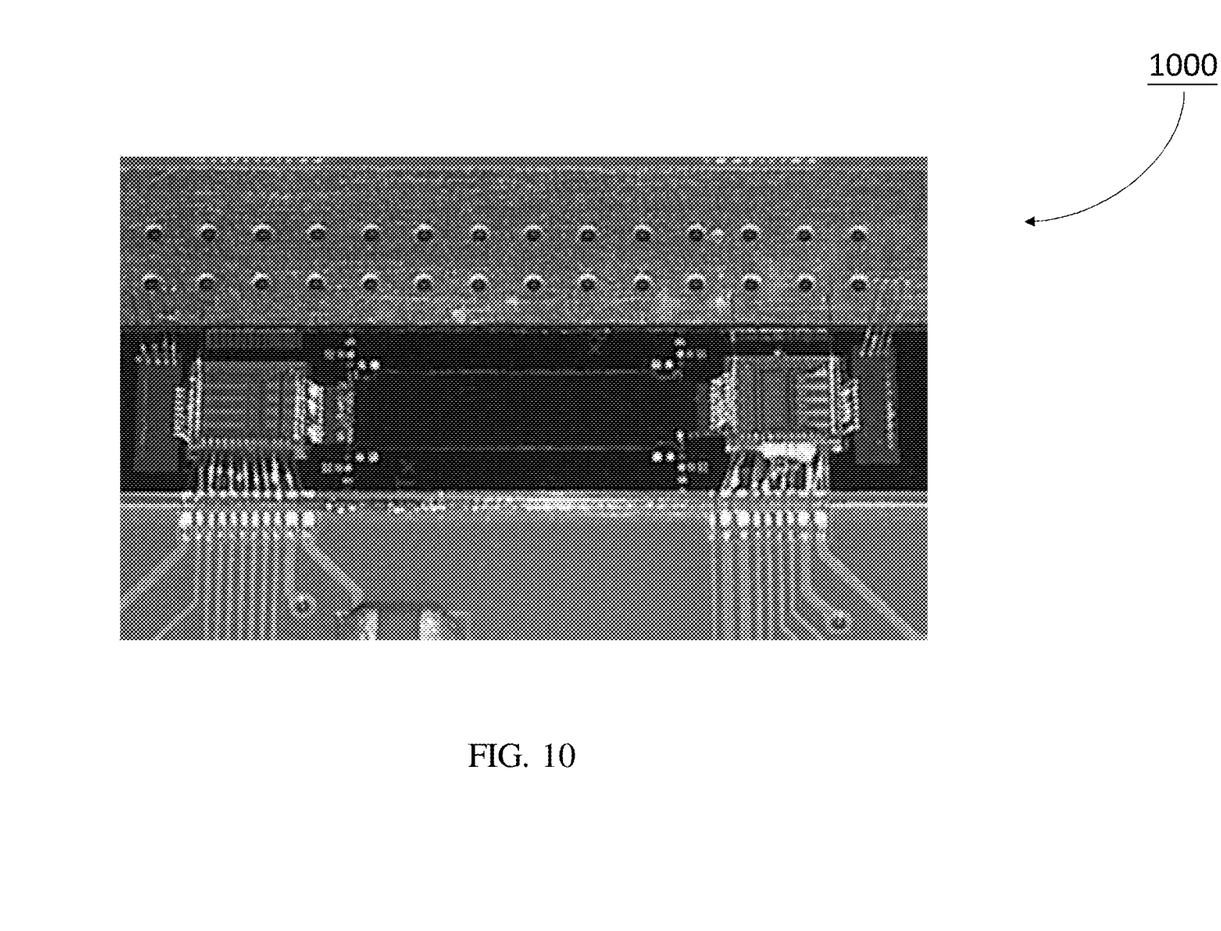
FIG. 10 illustrates a schematic diagram of the interconnect module disclosed in FIG. 9 which has been reduced to practice, in accordance with the disclosed embodiment.

FIG. 10 illustrates a schematic diagram of the interconnect module disclosed in FIG. 9, which has been reduced to practice, in accordance with the disclosed embodiment.

However, embodiments are not limited to this particular sequence, and alternative fabrication sequences are envisioned.

In utilizing the various aspects of the embodiments, it would become apparent to one skilled in the art that combinations or variations of the above embodiments are possible for fabricating optical interconnects. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A method of fabricating an optical interconnect apparatus, comprising:
    providing a silicon substrate having a top silicon surface;
    forming a trench on the top silicon surface;
    patterning a first and a second slanted side walls of the trench, wherein the first and second slanted sidewalls are opposite to each other;
    forming a plurality of polymer waveguides in the trench, comprising:
        depositing a first polymer cladding layer in the trench covering a bottom of the trench, the first and second slanted side walls, followed by depositing a polymer core layer on the first polymer cladding layer;
        patterning the polymer core layer and covering the patterned polymer core layer with a second polymer cladding layer, wherein the plurality of polymer waveguides each has one straight portion and two angled end reflectors, wherein the two angled end reflectors are formed on the first and second slanted sidewalls;
    depositing an insulating layer on the silicon top surface outside the trench;
    patterning conductive lines in the insulating layer;
    growing solder bumps on conductive lines for flip chip mounting with bond pads;
    connecting a light source device with one of the conductive lines near the first slanted side wall of the trench and an optical receiver device with another one of the conductive lines near the second slanted side wall of the trench; and
    aligning the light source device and the optical receiver device with the slanted end reflectors of the plurality of polymer waveguides.

2. A method of fabricating an optical interconnect apparatus in claim 1, wherein the light source device comprises a vertical cavity surface emitting laser (VCSEL) and wherein the optical receiver device comprises a photodetector (PD).

3. A method of fabricating an optical interconnect apparatus in claim 1, wherein patterning the first and second slanted side walls of the trench comprises applying a variable lithography exposure energy to achieve smooth and accurate slanted angles.

4. A method of fabricating an optical interconnect apparatus in claim 1, wherein the slanted end reflectors have approximately 45 degree slanted angles.

5. The method of fabricating an optical interconnect apparatus in claim 1, wherein patterning the plurality of conductive lines comprises forming trenches and filling a metal in the trenches, followed by removing excess metal by polishing (CMP) or by selective etch to clean up the metal outside the trenches.

6. The method of fabricating an optical interconnect apparatus in claim 1, wherein patterning the plurality of conductive lines comprises depositing a metal layer, patterning the metal layer into lines by selective etch, electroplating, or laser writing.

7. The method of fabricating an optical interconnect apparatus in claim 6, wherein the metal layer includes a metal from one of aluminum, tungsten, stainless steel, copper.

* * * * *